United States Patent
Boyer

(10) Patent No.: US 11,107,480 B2
(45) Date of Patent: Aug. 31, 2021

(54) SYSTEM AND METHOD FOR TRANSMITTING AN ORAL MESSAGE IN A VEHICLE

(71) Applicants: Continental Automotive France, Toulouse (FR); Continental Automotive GmbH, Hannover (DE)

(72) Inventor: Jean-Philippe Boyer, Le Chesnay (FR)

(73) Assignees: Continental Automotive France; Continental Automotive GmbH

( * ) Notice: Subject to any disclaimer, the term of this patent is extended or adjusted under 35 U.S.C. 154(b) by 123 days.

(21) Appl. No.: 16/485,512

(22) PCT Filed: Mar. 27, 2018

(86) PCT No.: PCT/FR2018/050738
§ 371 (c)(1),
(2) Date: Aug. 13, 2019

(87) PCT Pub. No.: WO2018/178558
PCT Pub. Date: Oct. 4, 2018

(65) Prior Publication Data
US 2020/0005799 A1  Jan. 2, 2020

(30) Foreign Application Priority Data

Mar. 28, 2017 (FR) ...................... 1752574

(51) Int. Cl.
*G10L 17/24* (2013.01)
*G08B 1/08* (2006.01)
(Continued)

(52) U.S. Cl.
CPC ................ *G10L 17/24* (2013.01); *G08B 1/08* (2013.01); *G10L 15/26* (2013.01); *H04R 1/10* (2013.01); *H04R 5/04* (2013.01); *H04R 2499/11* (2013.01)

(58) Field of Classification Search
CPC .......... G08B 1/08; G10L 15/26; G10L 17/24; G10L 19/00; G10L 21/043; G10L 13/027;
(Continued)

(56) References Cited

U.S. PATENT DOCUMENTS 3,586,977 A * 6/1971 Lustig ...................... A42B 3/30
455/351
4,359,604 A * 11/1982 Dumont ................... H03G 3/32
381/110
(Continued)

FOREIGN PATENT DOCUMENTS

| CN | 104115430 A | 10/2014 |
| EP | 1994728 A1 | 11/2008 |

(Continued)

OTHER PUBLICATIONS

International Search Report and Written Opinion for International Application No. PCT/FR2018/050738, dated Jul. 31, 2018—8 pages.
(Continued)

*Primary Examiner* — Gerald Gauthier
(74) *Attorney, Agent, or Firm* — RatnerPrestia

(57) ABSTRACT

A method for allowing at least one passenger, wearing a personal listening device broadcasting an audio signal, to hear an oral message uttered by an authorized person in a transport vehicle, the method including detecting, recording and encoding said oral message as a voice signal, configuring a "payload signal to noise" ratio in the perceived audio signal, in which the payload signal consists of the oral message and in which the noise consists of the audio signal and stray noise, at a value greater than a predetermined threshold, and broadcasting the voice signal on a wireless communication network, to a mobile terminal connected to
(Continued)

the personal listening device or directly to the personal listening device in order to broadcast it to the at least one passenger.

11 Claims, 1 Drawing Sheet

(51) Int. Cl.
 *H04R 1/10* (2006.01)
 *H04R 5/04* (2006.01)
 *G10L 15/26* (2006.01)
(58) Field of Classification Search
 CPC . H03G 3/32; H04R 1/10; H04R 5/023; H04R 5/04; H04R 2499/11; H04R 1/08; H04R 1/1041; G01C 21/3626; H04M 9/082
 USPC ...... 84/609; 340/463; 381/56, 71.4, 92, 117, 381/302, 365; 382/232; 455/3.01, 411, 455/418, 466, 569.2, 351, 567; 701/2; 704/227, 231, 233, 251, 260, 272, 275; 709/201; 345/7; 384/56, 71.4, 92, 117, 384/302, 365, 384
 See application file for complete search history.

(56) References Cited

U.S. PATENT DOCUMENTS

| | | | | | |
|---|---|---|---|---|---|
| 5,703,308 | A | * | 12/1997 | Tashiro | G10H 1/361 84/609 |
| 6,088,484 | A | * | 7/2000 | Mead | G10H 1/0058 348/E5.066 |
| 6,989,740 | B2 | * | 1/2006 | Tabe | B60Q 1/22 180/271 |
| 8,676,273 | B1 | * | 3/2014 | Fujisaki | H04M 3/533 455/567 |
| 8,686,922 | B2 | * | 4/2014 | Breed | B60R 21/01536 345/7 |
| 9,076,421 | B1 | * | 7/2015 | Munoz | G10H 1/361 |
| 2003/0053650 | A1 | * | 3/2003 | Wang | H04R 1/1041 381/384 |
| 2005/0190935 | A1 | * | 9/2005 | Sakamoto | H04R 5/02 381/302 |
| 2007/0201706 | A1 | * | 8/2007 | Yanai | H03F 1/26 381/117 |
| 2007/0223717 | A1 | | 9/2007 | Boersma | |
| 2009/0018841 | A1 | * | 1/2009 | Leeds | G11B 33/06 704/272 |
| 2010/0076764 | A1 | * | 3/2010 | Chengalvarayan | G10L 15/26 704/251 |
| 2010/0121636 | A1 | * | 5/2010 | Burke | G10L 25/78 704/233 |
| 2010/0208902 | A1 | * | 8/2010 | Yoshizawa | G10L 21/0208 381/56 |
| 2011/0075876 | A1 | * | 3/2011 | Bucheim | H04M 1/04 381/365 |
| 2011/0195699 | A1 | * | 8/2011 | Tadayon | H04W 4/029 455/418 |
| 2012/0231821 | A1 | * | 9/2012 | Swanson | H04W 4/14 455/466 |
| 2013/0096921 | A1 | * | 4/2013 | Kuwamoto | G08G 1/0962 704/260 |
| 2014/0044269 | A1 | | 2/2014 | Anderson | |
| 2014/0066132 | A1 | * | 3/2014 | Burke | H04L 67/12 455/569.2 |
| 2014/0112496 | A1 | * | 4/2014 | Murgia | G10L 21/06 381/92 |
| 2014/0188970 | A1 | * | 7/2014 | Madhok | H04L 67/04 709/201 |
| 2015/0023522 | A1 | | 1/2015 | Hommel et al. | |
| 2015/0056951 | A1 | * | 2/2015 | Talwar | H04W 12/069 455/411 |
| 2015/0256276 | A1 | * | 9/2015 | Jones | H04H 60/65 455/3.01 |
| 2015/0341005 | A1 | * | 11/2015 | Talwar | H03G 3/00 704/231 |
| 2016/0029111 | A1 | * | 1/2016 | Wacquant | H04R 3/005 381/71.4 |
| 2016/0064008 | A1 | * | 3/2016 | Graham | G10L 21/0208 704/227 |
| 2016/0077523 | A1 | * | 3/2016 | Zygmant | G08G 5/0013 701/2 |
| 2016/0174010 | A1 | * | 6/2016 | Mohammad | H04M 9/082 381/302 |
| 2016/0212522 | A1 | * | 7/2016 | Lee | B60W 50/14 |
| 2016/0267901 | A1 | * | 9/2016 | Zhao | G10L 13/027 |
| 2017/0026764 | A1 | * | 1/2017 | Rajendran | H03G 3/32 |
| 2017/0323639 | A1 | * | 11/2017 | Tzirkel-Hancock | H04M 1/6075 |
| 2018/0242081 | A1 | * | 8/2018 | Every | H04M 9/082 |
| 2020/0005799 | A1 | * | 1/2020 | Boyer | H03G 3/342 |

FOREIGN PATENT DOCUMENTS

| | | |
|---|---|---|
| JP | 2009194560 A | 8/2009 |
| WO | 2007102047 A1 | 9/2007 |
| WO | 2009077665 A1 | 6/2009 |

OTHER PUBLICATIONS

English Translation of Written Opinion for International Application No. PCT/FR2018/050738, dated Jul. 31, 2018, 6 pages
Chinese Office Action for Chinese Application No. 2018800221053, dated Oct. 10, 2020, with translation, 15 pages.
Chinese Office Action for Application No. 201880022105.3, dated May 27, 2021 with translation, 19 pages.

* cited by examiner

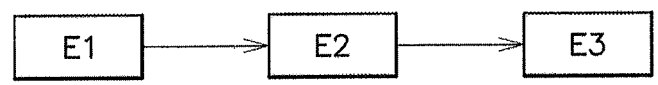
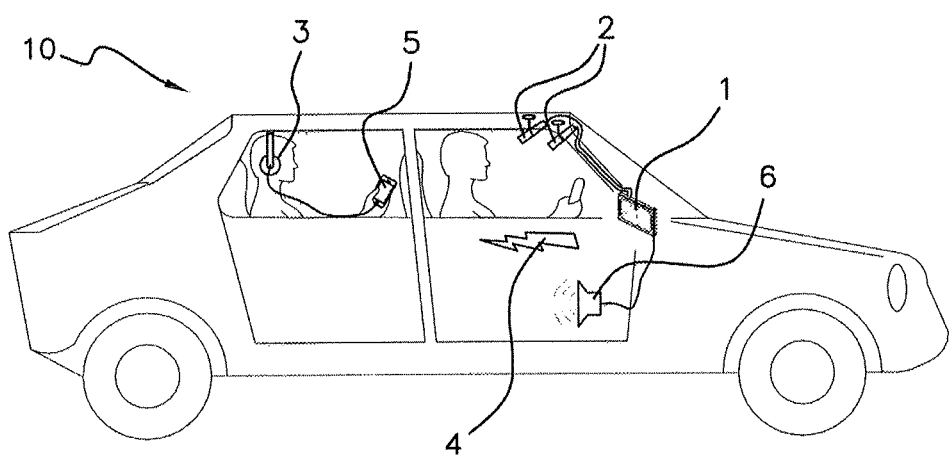
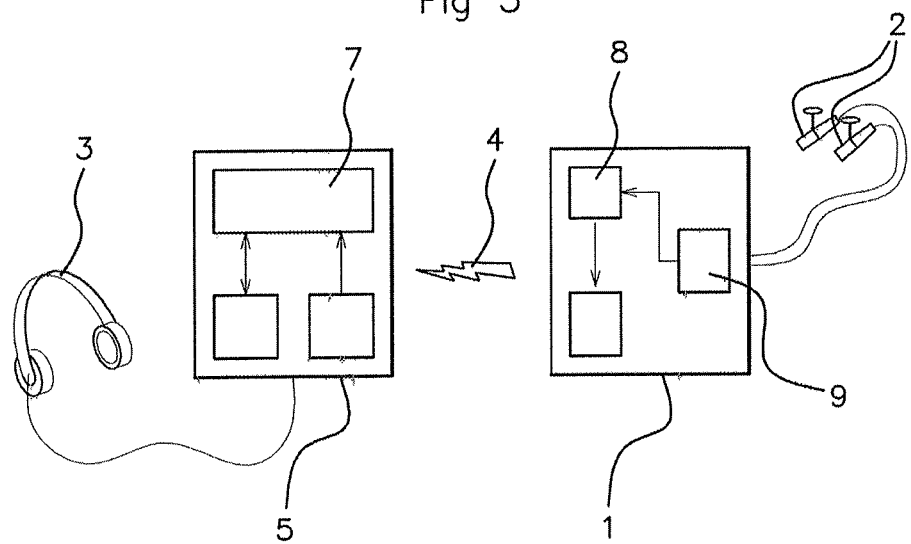

SYSTEM AND METHOD FOR TRANSMITTING AN ORAL MESSAGE IN A VEHICLE

CROSS REFERENCE TO RELATED APPLICATIONS

This application is the U.S. National Phase application of PCT International Application No. PCT/FR2018/050738, filed Mar. 27, 2018, which claims priority to French Patent Application No. 1752574, filed Mar. 28, 2017, the contents of such applications being incorporated by reference herein.

FIELD OF THE INVENTION

The invention pertains to the field of on-board entertainment systems in vehicles, in particular motor vehicles, and relates more precisely to the transmission of an oral message within a passenger transport vehicle passenger compartment, intended for at least one passenger using a personal listening means.

More particularly, the present invention targets a method and a system allowing an authorized person to address an oral message, which may in particular be safety-related, to at least one passenger equipped with a personal listening means.

BACKGROUND OF THE INVENTION

Many motor vehicles are nowadays equipped with a multimedia system or with an on-board entertainment system that is in particular able to play back an audio signal in the passenger compartment. At the same time, an increasing number of passengers are resorting to a personal listening means, such as an audio headset, to listen to an audio signal of their choice. The audio signal may originate from the multimedia system of the vehicle or come from a mobile communication terminal, such as a smartphone (mobile telephone) for example.

In the context in which an authorized person, for example the driver of the vehicle, wishes to communicate an oral message, in particular an important message that may be safety-related, the fact that a passenger is listening to an audio signal via a personal listening means may be an obstruction to hearing said oral message, in particular if the sound volume at which the audio signal is being listened to via the personal listening means is high.

This difficulty in making an oral message uttered for example by the driver and intended for the passengers of a vehicle audible is detrimental and may in particular pose a safety problem, since emergency instructions uttered by the driver may not be heard by the passengers.

Nowadays, to mitigate this problem, the only choice that the driver of a vehicle wishing to communicate an oral message to the passengers has is to raise his voice, in the hope of being heard. He may attempt to attract attention using gestures, but all of these known tricks do not ultimately always make it possible to be heard. In addition, they lead to a delay that is incompatible with emergency situations and may distract the driver uttering the oral message, generating a new safety problem.

Another known solution, in the context of commercial aircraft, consists in stopping the broadcasting of the audio signal listened to via the headset provided by the airline in order to broadcast, in its place, the oral message uttered by a crew member. However, this solution requires the personal audio headset of the passengers to be connected to the central multimedia system of the aircraft. This solution is therefore inapplicable to the case in which the passengers, whether in an aircraft or in a motor vehicle, are using a personal listening means connected to a personal audio source, such as a mobile terminal.

SUMMARY OF THE INVENTION

There is therefore a need for a method allowing an authorized person, such as the driver of a motor vehicle, to automatically make an oral message audible to at least one passenger equipped with a personal listening means broadcasting an audio signal.

To this end, according to an aspect of the invention, what is provided is a method comprising identifying an oral message uttered by an authorized person and needing to be made audible to at least one passenger equipped with a personal listening means, said method comprising means for configuring the payload signal to noise ratio in which the payload signal corresponds to the oral message, the audio signal broadcast by the personal listening means forming part of the noise.

More precisely, one subject of an aspect of the invention is a method for allowing at least one passenger to hear an oral message uttered by an authorized person in a transport means, said at least one passenger wearing a personal listening means associated or not associated with a mobile terminal and broadcasting an audio signal into the hearing apparatus of said at least one passenger, the oral message being uttered to the at least one passenger, said at least one passenger hearing a perceived audio signal comprising the audio signal, the oral message and stray noise, said method comprising the following steps:

- detecting the oral message intended to be made audible to said at least one passenger,
- recording the oral message,
- encoding said recorded oral message as a voice signal,
- configuring a "payload signal to noise" ratio in the perceived audio signal, in which the payload signal consists of the oral message and in which the audio signal and the stray noise form part of the noise, at a value greater than a predetermined threshold, so as to make the oral message audible to the at least one passenger, at the expense of the audio signal,
- broadcasting said voice signal on a wireless communication network, to a mobile terminal connected to the personal listening means or directly to the personal listening means in order to broadcast it into the hearing apparatus of said at least one passenger using said personal listening means.

By virtue of an aspect of the invention, a vehicle driver who has an oral message to transmit to the passengers of the vehicle is able to achieve this automatically and without having to raise his voice.

According to one embodiment, the step of detecting the oral message intended to be made audible to said at least one passenger comprises a sub-step of said authorized person activating a dedicated command, such as pressing a button or a voice recognition system detecting a predetermined keyword, for example.

According to one embodiment, the step of configuring the "payload signal to noise" ratio comprises reducing the listening volume of the audio signal.

According to another embodiment, the step of configuring the "payload signal to noise" ratio comprises stopping the broadcasting of the audio signal.

According to one embodiment, after the detection step, there is sending of a notification to a mobile terminal connected to the personal listening means, said notification comprising information relating to the fact that an oral message intended to be made audible to the at least one corresponding passenger has been uttered by an authorized person.

An aspect of the invention also covers a system for allowing at least one passenger to hear an oral message uttered by an authorized person in a transport means, said at least one passenger wearing a personal listening means broadcasting an audio signal into the hearing apparatus of said at least one passenger, the oral message being uttered to the at least one passenger, said system comprising:

- means for detecting an oral message intended to be made audible to said at least one passenger, said means being automatic or activatable,
- recording microphones for capturing said oral message,
- means for encoding said captured oral message as a voice signal,
- means for broadcasting said voice signal on a wireless communication network, to a mobile terminal connected to the personal listening means or directly to the personal listening means,
- means for configuring the "payload signal to noise" ratio in the perceived audio signal, corresponding to an audio signal played back via the personal listening means, said payload signal corresponding to the voice signal and the audio signal belonging to the noise, such that said voice message is made audible to said at least one passenger.

According to one embodiment, the mobile terminal comprises a software application able to modify the sound volume of the audio signal and the sound volume of the voice signal so as to make said voice signal audible to the at least one passenger.

According to one embodiment, the personal listening means does not require a mobile terminal and has embedded hardware and software means for pairing with an on-board entertainment system in the transport means.

An aspect of the invention also covers a motor vehicle comprising a system such as described above.

BRIEF DESCRIPTION OF THE DRAWINGS

Other features and advantages of aspects of the invention will emerge during the following description, given with reference to the appended figures, which are given by way of non-limiting example and in which identical references are given to similar objects.

FIG. 1 consists of a functional block diagram whose steps correspond to those of the method according to an aspect of the invention.

FIG. 2 shows the diagram of a vehicle equipped with a system able to implement an aspect of the invention.

FIG. 3 shows a basic diagram of one embodiment of a system for implementing an aspect of the invention.

DETAILED DESCRIPTION OF THE PREFERRED EMBODIMENTS

An aspect of the invention is contemplated primarily for the purpose of implementation in a motor vehicle. However, other applications, in particular the implementation of the system and of the method according to an aspect of the invention in any type of passenger transport means, is also targeted.

FIG. 1 shows a functional block diagram for describing the operating principle of the method according to an aspect of the invention.

Thus, in a passenger transport vehicle, such as a motor vehicle, in a context in which an authorized person, for example the driver of the motor vehicle, wishes to communicate an oral message to at least one passenger, said passenger being equipped with a personal listening means broadcasting an audio signal into his hearing apparatus, the method according to an aspect of the invention comprises a step of detecting E1 the oral message to be made audible to said passenger and a step of configuring E2 the payload signal to noise ratio, in which the payload signal corresponds to the oral message and in which the audio signal currently being broadcast in the personal listening means of the passenger as well as stray noise are contained in the noise, so as to prioritize said oral message and make it audible.

With reference to FIG. 2, by way of non-limiting illustration, what is shown is a vehicle 10 in the context of which an aspect of the present invention is able to be implemented. The vehicle 10 comprises an on-board entertainment system, often referred to as IVI for "in-vehicle infotainment" in accordance with the acronym known to those skilled in the art. This system comprises a computer 1, speakers 6 and recording microphones 2.

Wireless communication means 4 are also embedded, these means allowing data to be exchanged between the on-board entertainment system and any compatible apparatus, using the Wi-Fi, Bluetooth® or another standard.

In the vehicle 10, consideration is given to the presence of a passenger equipped with a personal listening means 3 by way of which said passenger is listening to an audio signal, for example music, from a multimedia database hosted on his mobile terminal 5, typically a smartphone.

In this embodiment of an aspect of the invention, with reference to FIG. 3, the voice signal forming the oral message uttered by the driver is captured by way of recording microphones 2 of the on-board entertainment system. The signal is preferably processed via the computer 1 in order to extract and remove that part of the signal that does not correspond to the oral message uttered by the driver but that originates, for example, from the speakers 6 from the signal captured by said recording microphones 2. ECNR for "echo cancellation noise reduction" software 9 is implemented for this purpose, for example.

According to one embodiment, voice recognition software 8, executed by the on-board entertainment system, analyzes the captured signal in order to verify that it is indeed a voice signal, corresponding to the oral message, and possibly that the issuer of the oral message is indeed an authorized person, typically the driver of the vehicle in our example.

According to another embodiment, the driver wishing to broadcast an oral message for the attention of a passenger performs an intentional action in order to trigger the recording of his oral message. To this end, according to one embodiment, the driver actuates a "push-to-talk" command in the manner of a walkie-talkie. According to another embodiment, the intentional action consists in speaking a keyword in a loud voice, which keyword is recognized by the voice recognition system 8 executed by the on-board entertainment system, so as to trigger the recording of the oral message following the keyword by way of the recording microphones 2.

The captured and, where applicable, processed voice signal is encoded and then sent via the communication link 4 to the personal mobile terminal 5 or directly to the personal listening means 3. According to one embodiment, a specific notification is furthermore sent to said mobile terminal 5. According to one embodiment, said notification is sent via an inaudible or virtually inaudible high-frequency audio signal that is processed by a noise-canceling sensor of the personal listening means 3.

The mobile terminal 5 receives the notification, where applicable, and in any case the voice signal. According to one embodiment, a dedicated software application 7, executed on the mobile terminal 5, processes the voice signal and, where applicable, the notification.

Said software application 7 then retransmits the voice signal on the audio output of the mobile terminal 5 so as to make said voice signal audible to the passenger via the personal listening means 3.

To this end, the software application 7 appropriately configures the broadcasting of the current audio signal, currently being listened to by the passenger, and that of the voice signal, such that the payload signal to noise ratio, in which the voice signal constitutes the payload signal, is favorable to the voice signal.

According to one embodiment, the voice signal is mixed with the audio signal currently being broadcast on which it is superimposed. The sound volume of the audio signal may be reduced, whereas the sound volume of the voice signal is set at a value higher than that of the sound volume of the audio signal currently being listened to.

According to another embodiment, the broadcasting of the audio signal currently being listened to is stopped or paused for the time of broadcasting of the voice message.

According to another embodiment, the oral message is not recorded by recording microphones 2 and then encoded and broadcast. In this case, when the utterance of the oral message by an authorized person is detected, the specific notification is transmitted and received by the mobile terminal 5, leading to the broadcasting of the audio signal currently being listened to being stopped or the broadcast sound volume of said audio signal currently being listened to being reduced, making the oral message audible to the passenger.

Thus, the passenger listening to an audio signal of his choice by way of a personal listening means is transparently and automatically able to hear the oral message uttered by the driver and take part in any conversation without having to stop the broadcasting of the chosen audio signal and without even having to remove his personal listening means, and without the driver being obliged to raise his voice in order to attract his attention.

It is clarified furthermore that an aspect of the present invention is not limited to the examples described above, and is open to many variants that are accessible to those skilled in the art.

In particular, according to one embodiment, there is provision to automatically activate the function of recording the voice of the driver, forming an oral message to be made audible to the passengers, when the system detects that the passengers' attention is required due to particular driving conditions.

According to one mode of implementation of the invention, there is provision for a specific autonomous personal listening means, in particular an audio headset, that does not require a communication terminal, said personal listening means having embedded software and hardware means for pairing with the on-board entertainment system and allowing the invention to be implemented.

The invention claimed is:

1. A method for allowing at least one passenger to hear an oral message uttered by an authorized person in a vehicle, said at least one passenger having a personal listening means having an audio speaker, said method comprising the following steps:
    detecting, by a microphone in the vehicle, the oral message uttered by the authorized person, the oral message intended to be made audible to said at least one passenger,
    recording, by a processor in the vehicle, the oral message,
    encoding, by the processor in the vehicle, said recorded oral message as a voice signal, and
    broadcasting said voice signal on a wireless communication network, i) to a mobile terminal connected to the personal listening means or ii) directly to the personal listening means, such that the audio speaker of said personal listening means outputs said voice signal to said at least one passenger.

2. The method as claimed in claim 1, wherein the step of detecting the oral message intended to be made audible to said at least one passenger comprises a sub-step of said authorized person activating a dedicated command, such as pressing a button or a voice recognition system detecting a predetermined keyword, for example.

3. The method as claimed in claim 1, wherein the processor broadcasts a control signal instructing said personal listening means to reduce listening volume of an audio signal being output by the audio speaker.

4. The method as claimed in claim 1, wherein the processor broadcasts a control signal instructing said personal listening means to stop playing an audio signal being output by the audio speaker.

5. The method as claimed in claim 1, comprising, after the detection step, sending a notification to a mobile terminal connected to the personal listening means, said notification comprising information relating to the fact that an oral message intended to be made audible to the at least one corresponding passenger has been uttered by an authorized person.

6. The method as claimed in claim 2, wherein the processor broadcasts a control signal instructing said personal listening means to reduce listening volume of an audio signal being output by the audio speaker.

7. The method as claimed in claim 2, wherein the processor broadcasts a control signal instructing said personal listening means to stop playing an audio signal being output by the audio speaker.

8. A system for allowing at least one passenger to hear an oral message uttered by an authorized person in a vehicle, said at least one passenger having a personal listening means having an audio speaker, said system comprising:
    a microphone in the vehicle for detecting an oral message uttered by the authorized person, the oral message intended to be made audible to said at least one passenger, said microphone being automatic or activatable; and
    a processor configured to:
        record said oral message,
        encode said captured oral message as a voice signal, and
        broadcast said voice signal on a wireless communication network, to a mobile terminal connected to the personal listening means or directly to the personal listening, such that said audio speaker of said personal listening means outputs said voice signal to said at least one passenger.

9. The system as claimed in claim 8, wherein the mobile terminal comprises a software application able to modify the sound volume of an audio signal being output by the audio speaker and the sound volume of the voice signal so as to make said voice signal audible to the at least one passenger.

10. The system as claimed in claim 8, wherein the personal listening means does not require a mobile terminal and has embedded hardware and software means for pairing with an on-board entertainment system in the transport means.

11. A motor vehicle comprising a system as claimed claim 8.

* * * * *